US008910092B1

(12) United States Patent
Shih et al.

(10) Patent No.: US 8,910,092 B1
(45) Date of Patent: Dec. 9, 2014

(54) MODEL BASED SIMULATION METHOD WITH FAST BIAS CONTOUR FOR LITHOGRAPHY PROCESS CHECK

(71) Applicant: Taiwan Semiconductor Manufacturing Co., Ltd., Hsin-Chu (TW)

(72) Inventors: I-Chang Shih, Zhubei (TW); Feng-Yuan Chiu, Zhudong Township (TW); Ying-Chou Cheng, Zhubei (TW); Chiu Hsiu Chen, Zhubei (TW); Ru-Gun Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/078,729

(22) Filed: Nov. 13, 2013

(51) Int. Cl.
*G06F 17/50* (2006.01)

(52) U.S. Cl.
CPC .................................. *G06F 17/5009* (2013.01)
USPC .................... 716/53; 716/50; 716/51; 716/54

(58) Field of Classification Search
USPC .......................................... 716/50, 51, 53, 54
See application file for complete search history.

(56) References Cited

U.S. PATENT DOCUMENTS

| 7,685,558 B2* | 3/2010 | Lai et al. ........................ 716/51 |
| 2010/0269084 A1* | 10/2010 | Granik ............................ 716/20 |
| 2010/0315614 A1* | 12/2010 | Hansen .......................... 355/67 |

OTHER PUBLICATIONS

Brodsky et al., "Lithography Budget Analysis at the Process Module Level", Mar. 2006, SPIE, Proceedings, vol. 61543Y, pp. 1-12.*
Foussadier et al., Model-Based Mask Verfication, Nov. 2007, SPIE, Proceedings, vol. 673051, pp. 1-8.*
Hamouda et.al., "Using Segmented Models for Initial Mask Perturbation and OPC Speedup", Sep. 2013, SPIE, Proceedings, vol. 88801, pp. 1-7.*
Candence "Cadence DFM Services: Simulation, Hotspot Detection/Correction, and Verification Down to 28nm." Published in 2011. 5 pages.

* cited by examiner

*Primary Examiner* — Sun Lin
(74) *Attorney, Agent, or Firm* — Eschweiler & Associates, LLC

(57) ABSTRACT

Integrated circuit design techniques are disclosed. In some methods, a target layout design having a geometric pattern thereon is received. A set of fast-bias contour (FBC) rules is applied to the target layout design to provide an electronic photomask having FBC-edits. The FBC-edits differentiate the electronic photomask from the target layout design, and the FBC rules are applied without previously applying optical proximity correction (OPC) to the target layout design. A lithography process check is performed on the electronic photomask to determine whether a patterned integrated circuit layer, which is to be manufactured based on the electronic photomask, is expected to be in conformance with the geometric pattern of the target layout design.

18 Claims, 4 Drawing Sheets

300

MODEL BASED SIMULATION METHOD WITH FAST BIAS CONTOUR FOR LITHOGRAPHY PROCESS CHECK

BACKGROUND

Design Rule Checking (DRC) is an area of Electronic Design Automation that determines whether integrated circuit (IC) features on a physical layout design satisfy a series of geometric connectivity requirements called "Design Rules" (or "DRCs"). Some example design rules verify whether there is sufficient spacing between an edge of one active area and an edge of an adjacent active area in the design, or whether there is sufficient spacing between an edge of one well region and an edge of an adjacent well region in the design. If these well regions are "too close" to one another (i.e., closer than minimum DRC requirements), unavoidable and small random manufacturing variations can cause some ICs, when actually manufactured, to fail to meet minimum performance metrics specified by the designer. Therefore, if one or more features on a physical layout design are not in compliance with DRC rules, DRC software flags an error so a designer can go back and make the physical layout design more "robust" prior to it being manufactured, so the final manufactured IC will meet design specifications even when manufacturing variations are encountered.

However, as technology advances to ever-smaller geometries, DRC-checking, although still an important step in the IC design process, is not in-and-of-itself a completely accurate predictor of whether manufactured ICs will meet yield specifications. For example, in many regards, DRC checking fails to account for variations in photolithography, variations in etching, variations in chemical mechanical polishing (CMP), and variations in mask manufacturing, among others. Because of this, modern IC design flows can have separate process checks in addition to DRC-checking for many parts of the manufacturing process.

DETAILED DESCRIPTION

Figure 1:
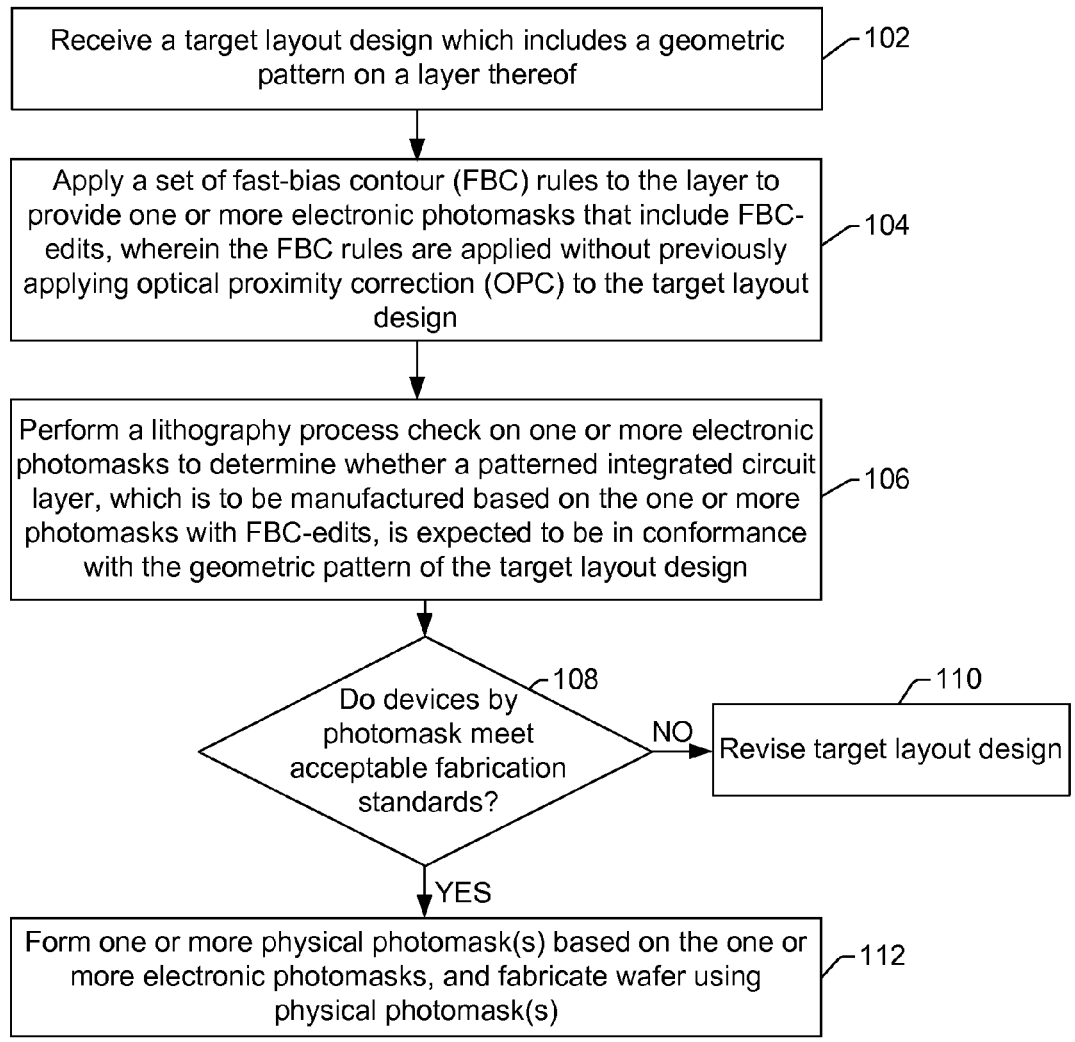
FIG. 1 shows some embodiments of a design flow that makes use of a fast-bias contour model.

One or more implementations of the present invention will now be described with reference to the attached drawings, wherein like reference numerals are used to refer to like elements throughout. The drawings are not drawn to scale.

In the area of photolithography, optical proximity correction (OPC) can be used to account for expected variations and/or imperfections in lithography. A typical design flow using OPC is as follows: a designer provides a target layout design, which includes a geometric pattern to be formed on a given IC layer, and which has already undergone DRC checking. A series of OPC-design rules are then applied to the target layout design to take into account photolithographic variations/irregularities which are expected to be encountered. For example, if the target layout design has line widths that are narrower than some predetermined lithography threshold, the OPC-design rules can define extra polygons, such as hammerhead patterns, that are to be included in one or more photomasks used to fabricate the target layout design. The OPC-edits are then streamed into the target layout design to generate one or more photomasks that will be used to manufacture the IC. The objective of OPC is to produce photomask(s) which will, as well as possible, produce the geometric patterns of a designer's target layout design on actual silicon wafers.

To verify whether an OPC-edited design layout will provide a photomask suitable for manufacturing ICs at some minimally acceptable yield criteria, lithography process checks (LPCs) are used. Compared to DRC-checks, which tend to be limited to whether static geometric relationships between chip features are accordance with pre-determined DRC rules, LPC techniques simulate an OPC-edited design layout many times using Monte-Carlo simulations. These Monte Carlo simulations randomly select process and lithography conditions from a range of such conditions provided by a foundry to attempt to identify so called design "hot spots", if any, where the OPC-edited design layout is expected to fail to meet yield criteria.

Whereas design flows that use solely DRC checking can run relatively quickly (e.g., less than a day or even in less than an hour); design flows that use OPC techniques can take significantly longer to run. This increase in time is due, at least in part, to the large number of simulations to be performed during LPC. However, not only does performing LPC take considerable time due to the large number of simulations required, but even prior to LPC the acts of performing OPC on a target layout design and streaming the OPC-edits into the target layout design layout can take significant time (e.g., sometimes performing OPC and streaming OPC-edits into a target layout design can take seven to ten times as long as the LPC simulations). Further, the "streamed in" OPC edits can add additional data size to the OPC-edited photomasks above and beyond that of the original target layout design layout. Given the large number of simulations to be performed during LPC, this additional data size can "bog down" the simulation system, and can add significant overall time to simulations. Hence, OPC editing and performing LPC can act as a bottleneck in IC design flows.

Therefore, aspects of the present disclosure are aimed at providing a design flow that can quickly and accurately identify "hot spots" in a proposed design to get designs to market more quickly. The disclosed design flows approximate OPC processes using a fast bias contour (FBC) model without first performing OPC. In other words, the FBC model is used to provide one or more electronic photomasks without actually generating OPC polygons and without performing other OPC steps. Because the FBC model provides a fast approximation for how a target layout design provided by a designer ought to be formed on photomask(s), this FBC-edited layout still provides relatively accurate simulation results, but with a much faster simulation time than by using fully OPC-modified photomasks.

FIG. 1 shows an example of a design flow 100 that makes use of an FBC model in accordance with some embodiments. The design flow 100 starts at 102 when a target layout design is received from an IC designer. The target layout design is an electronic file that typically includes multiple layers. Each layer includes a geometric pattern to be photo-lithographically patterned on a semiconductor workpiece. In some embodiments the target layout design is a .GDS or .GDSII file provided by Cadence Design Systems, but can also be other files, such as a .CIF file for example, used for mask production.

At 104, the method applies a set of fast-bias contour (FBC) rules to the layer of the target layout design to provide one or more electronic photomasks that include FBC-edits. The FBC-rules are applied without previously applying optical proximity correction (OPC) to the target layout design. Because the FBC rules are relatively fast to execute compared to OPC rules, the FBC-edited electronic photomask(s) are edited and generated more quickly than by using OPC. Thus, errors or "hot spots" can be quickly identified.

At 106, the method performs a lithography process check (LPC) on the one or more electronic photomasks to determine whether a patterned layer, which is to be manufactured based on the photomasks with the FBC-edits, is expected to be in conformance with the geometric pattern of the target layout design. Performing LPC typically includes simulating the design of the one or more photomasks a large number of times, for example using Monte Carlo techniques, where each simulation has a different set of randomly chosen input lithography parameters that can vary during manufacturing due to random, uncontrollable process variation or other systematic variation. For example, the input lithography parameters can include manufacturing tolerances for mask features, expected variation in imaging depth or distance between a photomask and a workpiece, expected variation in light intensity, expected variation in wavelength of incident radiation, and so on. The range of variation for each input lithography parameter can provided by a foundry or other entity, such that the Monte Carlo simulations are collectively predictive of what an actual wafer is likely to experience when being manufactured.

At 108, the method determines if the electronic photomask(s) are expected to meet acceptable fabrication standards, such as a predetermined yield criteria. If the acceptable fabrication standards are not met (NO at 108), then an error is flagged and an IC designer or automated software can revise the target layout design in 110. On the other hand, if the acceptable fabrication standards are met (YES at 108), physical photomask(s) are formed based on the electronic photomask(s). A semiconductor wafer, which typically includes a plurality of die that each have a series of vertically patterned layers corresponding to features on the physical photomasks, is then formed based on the physical photomasks.

As an example of how steps 108-112 can manifest themselves, consider a case where a designer specifies that ninety-eight percent of manufactured ICs meet a set of minimum performance metrics, and where 500,000 simulations are performed in LPC checking. If less than ninety eight percent of the FBC-edited simulations (i.e., if less than 490,000 simulations) meet the minimum performance metrics, then the electronic photomask(s) with FBC-edits would fail to meet acceptable fabrication standards and revisions can be made in 110. On the other hand, if greater than ninety eight percent of the simulations (i.e., if greater than 490,000 simulations) meet the minimum performance metrics, then the photomask(s) with the FBC edits would meet acceptable fabrication standards and physical photomasks can be made in 112.

It will be appreciated that although these methods each illustrate a number of acts, not all of these acts are necessarily required, and other un-illustrated acts may also be present. Also, the ordering of the acts in some embodiments can vary from what is illustrated in these figures. In addition, the illustrated acts can be further divided into sub-acts in some implementations, while in other implementations some of the illustrated acts can be carried out concurrently with one another.

Figure 2:
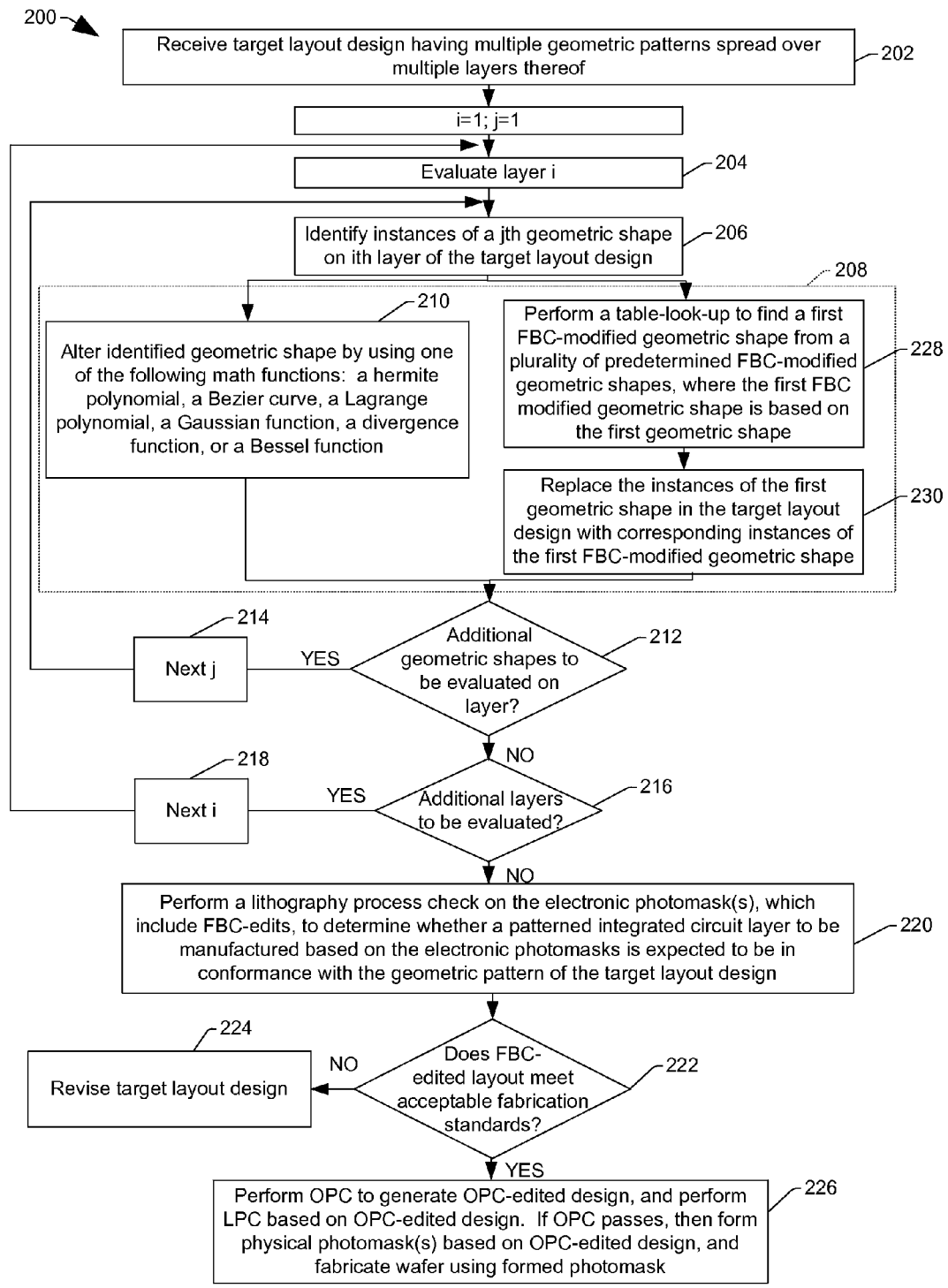
FIG. 2 shows some embodiments of a design flow that makes use of a fast-bias contour model.

Referring now to FIG. 2, one can see another example of a design flow 200 in accordance with some embodiments.

At 202, a target layout design, which includes multiple geometric patterns spread over multiple IC layers, is received. The geometric patterns on the individual IC layers can correspond to one or more photomasks that ultimately imprint the individual geometric patterns on semiconductor wafers.

Starting at 204, a first layer (i=1) of the target layout design is evaluated.

At 206, to begin evaluation of this first layer, the method identifies instances of a $1^{st}$ (j=1) geometric shape on first layer.

In 208, two methods of making FBC-edits are illustrated. Whichever method is used, at the end of 208, a set of electronic photomasks, each of which can include FBC-edits that were not present in the target layout design, is produced.

Figure 3:
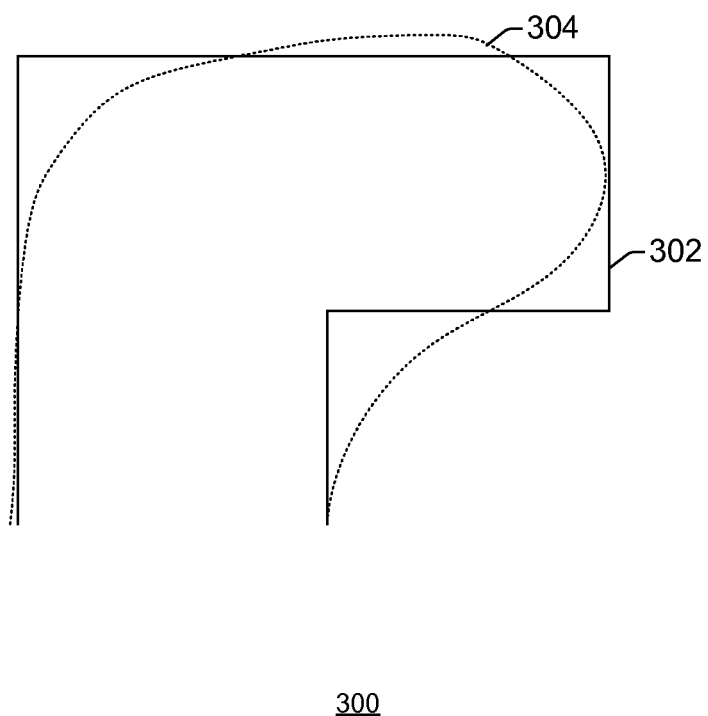
FIG. 3 shows an example FBC-pattern that is based on a corresponding pattern for a target layout design provided by a designer.

In the first method 210, an outer contour of the identified geometric shape is altered by using one of the following math functions: a Hermite polynomial, a Bezier curve, a Lagrange polynomial, a Gaussian function, a divergence function, or a Bessel function. Referring briefly to FIG. 3, one can see an example of a geometric feature 302 on a target layout design, and a FBC-edited contour 304 for the geometric feature 302. In some embodiments, the FBC-edited contour 304 is generated solely by applying a math function, such as listed above, to the geometric feature 302 of the target layout design without previously performing OPC on the target layout design. As shown, the math function can provide a continuous contour with corner rounding. Compared to full-blown OPC rules, which are extremely complex, determining how photomask patterns should look by applying a straightforward math function saves simulation time.

Referring back to FIG. 2, after the $1^{st}$ geometric shape is altered in 210, the method can determine whether additional geometric shapes are to be evaluated on the first layer in 212. If so (YES at 212), j is incremented in 214, and the next geometric shape is evaluated in 206/210. If there are no more geometric shapes to be evaluated on the first layer (NO at 212), then the method determines if there are additional layers to be evaluated in the target layout design in 216. If so (YES at 216), i is incremented in 218, and the method evaluates the next layer of the target layout design at 204/206/210. For example, a first layer that corresponds to a well region could be evaluated first, while later layers that correspond to source/drain regions, metal layer patterning, and other IC layers, could be evaluated subsequently.

At 220, after all layers are evaluated, a lithography process check (LPC) is performed on the electronic photomask(s) and their FBC-edits. LPC runs a series of Monte Carlo simulations with different input lithography and device parameters to model how the electronic photomask will be expected to manufacture actual devices, taking in account expected photolithography variations and expected manufacturing variations.

If the Monte Carlo simulations reveal that the electronic photomask having FBC-edits will not result in acceptable yields (NO at 222), then an error can be flagged so the target layout design can be revised in 224. Alternatively, if the Monte Carlo simulations reveal the electronic photomasks having FBC-edits will result in acceptable yields (YES at 222), in 226 full blown OPC can then be performed to add polygons, move line edges, etc, and LPC can be re-run on the OPC-edited design to provide further assurances that the target layout design will result in acceptable yields. If OPC confirms the target layout design is sufficient, than physical photomasks can be fabricated and used to manufacture actual ICs. If OPC fails, of course, the target layout design can be further revised.

The alternative FBC-technique of 228/230 is now described. In this technique, in 228 the method performs a table-look-up to find a first FBC-modified geometric shape from a plurality of predetermined FBC-modified geometric shapes, where the first FBC modified geometric shape is also based on the identified geometric shape from 206. In 230, the method replaces the instances of the geometric shape identified in the target layout design with corresponding instances of the first FBC-modified geometric shape. Because this lookup table methodology does not use complex OPC rules to add polygons and/or modify shapes, it provides an improvement in simulation times so the "hot spots", if any, in the design can be quickly identified.

Figure 4:
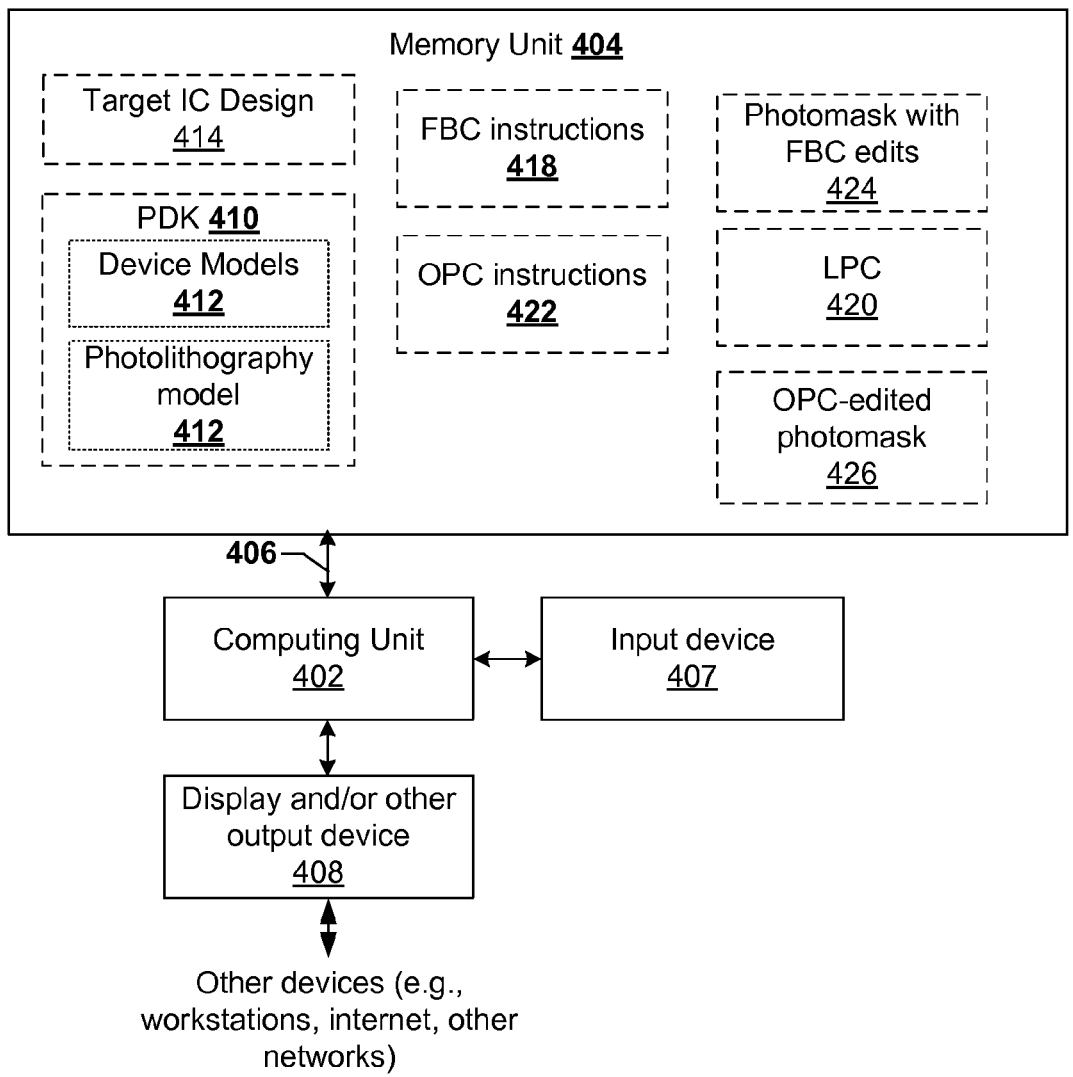
FIG. 4 shows some embodiments of a tool arrangement for circuit design.

FIG. 4 illustrates some embodiments of a tool arrangement 400 for circuit design. The tool arrangement includes a computing unit 402, such as one or more microprocessors, which is operably coupled to a memory unit 404 via one or more busses 406. Based on computer executable instructions stored in memory 404, the computing unit 402 is capable of performing the methods previously described in this disclosure. To facilitate this behavior, the tool arrangement 400 also includes an input device 407, such as a keyboard or other mechanism for one or more designers to enter data into the tool arrangement 400. A visual display 408 and/or other output device, such as a printer, is also coupled to the computing unit 402 to allow a designer to view the simulation results and/or IC designs provided by the tool arrangement 400. Other output devices may allow the tool arrangement to be coupled to other devices (e.g., workstations) and/or to the internet, local area network, or wide area network for example.

Memory unit 404 is configured to store digitized data representing a process design kit (PDK) 410, which can include device models 412 and photolithography models 413 provided by a fabrication facility across process corners. The memory unit 404 can also store a target layout design 414, which is to be evaluated over a wide range of process conditions which are specified by data input sets. Lastly, computer executable LPC instructions 418, FBC instructions 420, and OPC instructions 422, are also in memory unit 404.

During operation, computing unit 402, typically after receiving a command from the input device 407, executes FBC rule on target design 414 to generate a photomask with FBC edits 424. The LPC instructions then simulate the photomask 424 to determine whether a sufficient percentage of devices manufactured using the photomask 424 will operate at minimum performance metrics. The device models 412 and photolithography models 413 are used in the simulation, which often takes the form of a Monte Carlo simulation. If the photomask with FBC edits fails LPC testing, an error is quickly flagged so a designer can revise the target IC design 414. On the other hand, if the photomask with FBC edits passes LPC testing, then OPC instructions 422 are applied to the target layout design 414 to generate an OPC-edited layout design 426, which may include additional polygons and lines/edges that are moved relative to the target layout design 414. The OPC-edited photomask then undergoes LPC testing 420, and further revisions can be made, if necessary, before a physical photomask is ultimately manufactured based on the OPC-edited photomask 426.

It will be appreciated that "substrate", "semiconductor workpiece" or "wafer" as referred to herein may comprise any type of semiconductor material including a bulk silicon wafer, a binary compound substrate (e.g., GaAs wafer), a ternary compound substrate (e.g., AlGaAs), or higher order compound wafers, with or without additional insulating or conducting layers formed there over, among others. Further, the semiconductor workpiece can also include non-semiconductor materials such as oxide in silicon-on-insulator (SOI), partial SOI substrate, polysilicon, insulator, oxide, metal, amorphous silicon, or organic material, among others. In some embodiments, the semiconductor workpiece can also include multiple wafers or dies which are stacked or otherwise adhered together. The semiconductor workpiece can include wafers which are cut from a silicon ingot, and/or any other type of semiconductor/non-semiconductor and/or deposited or grown (e.g. epitaxial) layers formed on an underlying substrate.

Thus, it will be appreciated that some embodiments relate to a method for designing ICs. In this method, a target layout design is received which has a geometric pattern thereon. A set of fast-bias contour (FBC) rules are applied to the target layout design to provide an electronic photomask wherein the FBC rules are applied without previously applying optical proximity correction (OPC) to the target layout design. This electronic photomask has FBC-edits that differentiate the electronic photomask from the target layout design. A lithography process check is performed on the electronic photomask to determine whether a patterned integrated circuit layer, which is to be manufactured based on the electronic photomask, is expected to be in conformance with the geometric pattern of the target layout design.

Other embodiments relate to IC design methods. In these methods, a target layout design is received. The target layout design has multiple layers with multiple geometric patterns thereon. The method identifies instances of a first geometric shape on a first layer of the target layout design. A set of fast-bias contour (FBC) rules are applied to the identified instances of the first geometric shape to generate an electronic photomask. This electronic photomask has FBC-edits that differentiate the electronic photomask from the target layout design. A lithography process check is performed on the electronic photomask to determine whether a patterned integrated circuit layer, which is to be manufactured based on the electronic photomask, is expected to be in conformance with the geometric pattern of the target layout design.

Still other embodiments relate to a circuit simulation tool. The circuit simulation tool includes a computing unit operably coupled to a memory unit via one or more busses. The memory unit is configured to store digitized data representing a target layout design, computer executable lithography process check (LPC) instructions, computer executable fast-bias contour (FBC) instructions, and optical proximity correction (OPC) instructions. The computing unit is configured to apply FBC instructions on the target layout design to generate a photomask with FBC edits, and then apply LCP instructions to determine whether a sufficient percentage of devices manufactured using the photomask are expected to operate at minimum performance metrics.

In addition, it will be appreciated that identifiers such as "first" and "second" do not imply any type of ordering, placement, or temporal relationship with respect to other elements; but rather "first" and "second" and other similar identifiers are just generic identifiers and these elements can be swapped in other implementations.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method, comprising:
receiving a target layout design having a geometric pattern thereon;
using a computing unit to apply a set of fast-bias contour (FBC) rules to the target layout design to provide an electronic photomask having FBC-edits that differentiate the electronic photomask from the target layout design, wherein the FBC rules are applied without previously applying optical proximity correction (OPC) to the target layout design; and
performing a lithography process check on the electronic photomask to determine whether a patterned integrated circuit layer, which is to be manufactured based on the electronic photomask, is expected to be in conformance with the geometric pattern of the target layout design;
wherein the lithography process check includes a Monte-Carlo process where a plurality of device parameters are randomly varied for a plurality of simulations to characterize how semiconductor devices are expected to be manufactured based on the electronic photomask, which includes the FBC-edits.

2. The method of claim 1, wherein the FBC rules alter patterns for individual layers of the target layout design by using a math function or table-lookup to approximate OPC without actually performing OPC.

3. The method of claim 2, wherein the FBC rules alter patterns for individual layers of the target layout design by using one of the following math functions: a Hermite polynomial, a Bezier curve, a Lagrange polynomial, a Gaussian function, a divergence function, or a Bessel function.

4. The method of claim 2, wherein applying the FBC rules comprises:
identifying instances of a first geometric shape in the target layout design;
performing a table-look-up of a first FBC-modified geometric shape, which is based on the first geometric shape, from a plurality of predetermined FBC-modified geometric shapes; and
generating the electronic photomask by replacing the instances of the first geometric shape in the target layout design with corresponding instances of the first FBC-modified geometric shape.

5. The method of claim 4, wherein applying the FBC rules further comprises:
identifying instances of a second geometric shape in the target layout design;
performing a table-look-up of a second FBC-modified geometric shape, which is based on the second geometric shape, from the plurality of predetermined FBC-modified geometric shapes; and
generating the electronic photomask by replacing the instances of the second geometric shape in the target layout design with corresponding instances of the second FBC-modified geometric shape.

6. A method, comprising:
receiving a target layout design having a geometric pattern thereon;
using a computing unit to apply a set of fast-bias contour (FBC) rules to the target layout design to provide an electronic photomask having FBC-edits that differentiate the electronic photomask from the target layout design, wherein the FBC rules are applied without previously applying optical proximity correction (OPC) to the target layout design;
performing a lithography process check on the electronic photomask to determine whether a patterned integrated circuit layer, which is to be manufactured based on the electronic photomask, is expected to be in conformance with the geometric pattern of the target layout design;
setting a manufacturing yield criteria;
determining whether a plurality of simulation results for the plurality of simulations, respectively, meet performance metrics specified for the target layout design; and
providing a simulated yield result which specifies how many of the simulation results meet the performance metrics specified for the target layout design.

7. The method of claim 6, further comprising:
selectively providing an error message based on whether the simulated yield result is less than the manufacturing yield criteria.

8. A method, comprising:
receiving a target layout design having multiple layers with multiple geometric patterns thereon;
using a computing unit to identify instances of a first geometric shape on a first layer of the target layout design;
using a computing unit to apply a set of fast-bias contour (FBC) rules to the identified instances of the first geometric shape to generate an electronic photomask having FBC-edits that differentiate the electronic photomask from the target layout design;
performing a lithography process check on the electronic photomask to determine whether a patterned integrated circuit layer, which is to be manufactured based on the electronic photomask, is expected to be in conformance with the geometric pattern of the target layout design;
wherein the FBC rules alter patterns for individual layers of the target layout design by using one of the following math functions: a Hermite polynomial, a Bezier curve, a Lagrange polynomial, a Gaussian function, a divergence function, or a Bessel function.

9. The method of claim 8, wherein the FBC rules are applied without previously applying optical proximity correction (OPC) to the target layout design.

10. The method of claim 8, wherein the FBC-rules alter patterns for individual layers of the target layout design by using a math function or table-lookup to approximate OPC without actually performing OPC.

11. The method of claim 8, wherein applying the FBC rules comprises:
identifying instances of a first geometric shape in the target layout design;
performing a table-look-up of a first FBC-modified geometric shape, which is based on the first geometric shape, from a plurality of predetermined FBC-modified geometric shapes; and generating the electronic photomask by replacing the instances of the first geometric shape in the target layout design with corresponding instances of the first FBC-modified geometric shape.

12. The method of claim 8, further comprising:
setting a manufacturing yield criteria;
determining whether a plurality of simulation results for the plurality of simulations, respectively, meet performance metrics specified for the target layout design; and
providing a simulated yield result which specifies how many of the simulation results meet the performance metrics specified for the target layout design.

13. The method of claim 12, further comprising:
flagging an error if the simulated yield result does not meet the performance metrics to trigger revision of the target layout design.

14. The method of claim 12, further comprising:
if the simulated yield result meets the performance metrics, then performing optical proximity correction to further verify the target layout design.

15. A circuit simulation tool, comprising:
a computing unit operably coupled to a memory unit via one or more busses;
wherein the memory unit is configured to store digitized data representing a target layout design, computer executable lithography process check (LPC) instructions, computer executable fast-bias contour (FBC) instructions, and optical proximity correction (OPC) instructions;
wherein the computing unit is configured to apply the FBC instructions on the target layout design to generate a photomask with FBC edits, and then apply the LPC instructions to determine whether a sufficient percentage of devices manufactured using the photomask are expected to operate at minimum performance metrics.

16. The circuit simulation tool of claim 15, wherein the computing unit is configured to flag an error and not apply the OPC instructions to the target layout design in cases when the photomask with FBC edits fails LPC testing.

17. The circuit simulation tool of claim 15, wherein the LPC instructions carry out a Monte Carlo simulation using the photomask.

18. The circuit simulation tool of claim 17, wherein if the photomask with FBC edits passes LPC testing, then the OPC instructions are applied to the target layout design to generate an OPC-edited layout design, which may include additional polygons and lines/edges that are moved relative to the target layout design.

\* \* \* \* \*